United States Patent
Poo et al.

(10) Patent No.: US 7,358,154 B2
(45) Date of Patent: Apr. 15, 2008

(54) METHOD FOR FABRICATING PACKAGED DIE

(75) Inventors: Chia Yong Poo, Singapore (SG); Boon Suan Jeung, Singapore (SG); Low Siu Waf, Singapore (SG); Chan Min Yu, Singapore (SG); Neo Yong Loo, Singapore (SG); Eng Meow Koon, Singapore (SG); Ser Bok Leng, Singapore (SG); Chua Swee Kwang, Singapore (SG); So Chee Chung, Singapore (SG); Ho Kwok Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 11/281,084

(22) Filed: Nov. 17, 2005

(65) Prior Publication Data

US 2006/0084240 A1  Apr. 20, 2006

Related U.S. Application Data

(62) Division of application No. 10/929,932, filed on Aug. 30, 2004, which is a division of application No. 10/118,576, filed on Apr. 8, 2002, now Pat. No. 6,894,386.

(30) Foreign Application Priority Data

Oct. 8, 2001 (SG) ............................ 200106182-9

(51) Int. Cl.
H01L 21/00 (2006.01)

(52) U.S. Cl. ................ 438/462; 257/E21.484

(58) Field of Classification Search ................ 438/113, 438/460, 462; 257/E21.484
See application file for complete search history.

(56) References Cited

U.S. PATENT DOCUMENTS 3,735,214 A    5/1973  Renskers et al.

(Continued)

FOREIGN PATENT DOCUMENTS

CA          2330426       11/1998

(Continued)

OTHER PUBLICATIONS

"Search Report for Singapore Patent Application No. 200302511-1", (May 12, 2005),17 pgs.

(Continued)

Primary Examiner—W. David Coleman
(74) Attorney, Agent, or Firm—Schwegman, Lundberg & Woessner, P.A.

(57) ABSTRACT

Methods for forming an edge contact on a die and edge contact structures are described. The edge contacts on the die do not increase the height of the die. The edge contacts are positioned on the periphery of a die. The edge contacts are positioned in the saw streets. Each edge contact is connected to one bond pad of each die adjacent the saw street. The edge contact is divided into contacts for each adjacent die when the dies are separated. In an embodiment, a recess is formed in the saw street. In an embodiment, the recess is formed by scribing the saw street with a mechanical cutter. The recess is patterned and contact material is deposited to form the edge contacts.

24 Claims, 11 Drawing Sheets

U.S. PATENT DOCUMENTS

| | | |
|---|---|---|
| 4,141,456 A | 2/1979 | Hart |
| 4,355,457 A | 10/1982 | Barlett et al. |
| 4,610,079 A | 9/1986 | Abe et al. |
| 4,668,032 A | 5/1987 | Bouvier et al. |
| 4,764,846 A | 8/1988 | Go |
| 4,871,418 A | 10/1989 | Wittlinger et al. |
| 4,896,459 A | 1/1990 | Brandt |
| 4,930,216 A | 6/1990 | Nelson |
| 4,961,821 A | 10/1990 | Drake et al. |
| 4,983,251 A | 1/1991 | Haisama et al. |
| 5,091,331 A | 2/1992 | Delgado et al. |
| 5,126,286 A | 6/1992 | Chance et al. |
| 5,146,308 A | 9/1992 | Chance et al. |
| 5,166,097 A | 11/1992 | Tanielian |
| 5,218,229 A | 6/1993 | Farnworth |
| 5,272,114 A | 12/1993 | Berkum van et al. |
| 5,302,554 A | 4/1994 | Kashiwa et al. |
| 5,302,849 A | 4/1994 | Cavasin |
| 5,356,081 A | 10/1994 | Sellar |
| 5,543,365 A | 8/1996 | Wills et al. |
| 5,552,345 A | 9/1996 | Schrantz et al. |
| 5,606,198 A | 2/1997 | Ono et al. |
| 5,648,684 A | 7/1997 | Bertin et al. |
| 5,661,901 A | 9/1997 | King |
| 5,663,105 A | 9/1997 | Sua et al. |
| 5,729,437 A | 3/1998 | Hashimoto |
| 5,825,076 A | 10/1998 | Kotvas et al. |
| 5,856,937 A | 1/1999 | Chu et al. |
| 5,879,964 A | 3/1999 | Paik et al. |
| 5,888,884 A | 3/1999 | Wojnarowski |
| 5,902,499 A | 5/1999 | Richerzhagen |
| 5,904,546 A | 5/1999 | Wood et al. |
| 5,904,548 A | 5/1999 | Orcutt |
| 5,925,934 A | 7/1999 | Lim |
| 5,952,611 A | 9/1999 | Eng et al. |
| 5,990,566 A | 11/1999 | Farnworth et al. |
| 6,040,618 A | 3/2000 | Akram |
| 6,054,760 A | 4/2000 | Tovar et al. |
| 6,075,710 A | 6/2000 | Lau |
| 6,087,203 A | 7/2000 | Eng |
| 6,096,635 A | 8/2000 | Mou et al. |
| 6,133,065 A | 10/2000 | Akram |
| 6,137,164 A | 10/2000 | Yew et al. |
| 6,221,751 B1 * | 4/2001 | Chen et al. ............ 438/612 |
| 6,228,687 B1 | 5/2001 | Akram et al. |
| 6,236,107 B1 | 5/2001 | Chan et al. |
| 6,271,060 B1 | 8/2001 | Zandman et al. |
| 6,291,894 B1 | 9/2001 | Farnworth et al. |
| 6,294,837 B1 | 9/2001 | Akram et al. |
| 6,295,978 B1 | 10/2001 | Wark et al. |
| 6,319,354 B1 | 11/2001 | Farnworth et al. |
| 6,326,689 B1 | 12/2001 | Thomas |
| 6,365,833 B1 | 4/2002 | Eng et al. |
| 6,379,999 B1 | 4/2002 | Tanabe |
| 6,383,835 B1 | 5/2002 | Hata et al. |
| 6,387,729 B2 | 5/2002 | Eng et al. |
| 6,414,374 B2 | 7/2002 | Faraworth et al. |
| 6,427,676 B2 | 8/2002 | Akram et al. |
| 6,462,399 B1 | 10/2002 | Akram |
| 6,521,995 B1 | 2/2003 | Akram et al. |
| 6,534,382 B1 | 3/2003 | Sakaguchi et al. |
| 6,555,294 B1 | 4/2003 | Albertini et al. |
| 6,624,505 B2 * | 9/2003 | Badehi ............ 257/678 |
| 6,656,765 B1 | 12/2003 | DiCaprio |
| 6,717,245 B1 | 4/2004 | Kinsman et al. |
| 6,733,711 B2 | 5/2004 | Durocher et al. |
| 6,894,386 B2 | 5/2005 | Poo et al. |
| 6,930,382 B2 | 8/2005 | Sawada et al. |
| 6,946,324 B1 | 9/2005 | McLellan et al. |
| 2001/0030357 A1 | 10/2001 | Murata |
| 2002/0001882 A1 | 1/2002 | Eng et al. |
| 2002/0019069 A1 | 2/2002 | Wada |
| 2002/0031864 A1 | 3/2002 | Ball |
| 2002/0089043 A1 | 7/2002 | Park et al. |
| 2002/0094607 A1 | 7/2002 | Gebauer et al. |
| 2002/0123213 A1 | 9/2002 | Williams |
| 2002/0139577 A1 | 10/2002 | Miller |
| 2002/0164838 A1 | 11/2002 | Moon et al. |
| 2003/0060034 A1 | 3/2003 | Beyne et al. |
| 2003/0071335 A1 | 4/2003 | Jeung et al. |
| 2003/0071341 A1 | 4/2003 | Jeung et al. |
| 2003/0082845 A1 | 5/2003 | Hoffman et al. |
| 2004/0188400 A1 | 9/2004 | Peng et al. |
| 2005/0029668 A1 | 2/2005 | Poo et al. |

FOREIGN PATENT DOCUMENTS

| | | |
|---|---|---|
| EP | 0689245 A2 | 12/1995 |
| EP | 689245 A2 | 12/1995 |
| EP | 0818818 | 1/1998 |
| EP | 1071126 A2 | 1/2001 |
| JP | 58-036939 | 3/1983 |
| JP | 2002-170904 | 6/2002 |
| WO | WO-99/56907 | 11/1999 |
| WO | WO-00/75983 | 12/2000 |
| WO | WO-00/75985 A1 | 12/2000 |
| WO | WO-01/75966 | 10/2001 |

OTHER PUBLICATIONS

"U.S. Appl. No. 10/232,267, Non-final Office Action mailed Jul. 2, 2007", 9 pgs.

"U.S. Appl. No. 10-118576, Amendment and Response filed Jan. 26, 2004 to Final office action mailed Nov. 28, 2003", 13 pgs.

"U.S. Appl. No. 10-118576, Final office action mailed Nov. 28, 2003", 24 pgs.

"U.S. Appl. No. 10-118576, Non-final office action mailed Mar. 1, 2004", 8 pgs.

"U.S. Appl. No. 10-118576, Non-final office action mailed Jun. 10, 2003", 23 pgs.

"U.S. Appl. No. 10-118576, Non-final office action mailed Aug. 16, 2004", 8 pgs.

"U.S. Appl. No. 10-118576, Notice of allowance mailed Jan. 6, 2005", 5 pgs.

"U.S. Appl. No. 10-118576, Response filed May 28, 2004 to Non-final office action mailed Mar. 1, 2004", 8 pgs.

"U.S. Appl. No. 10-118576, Response filed Sep. 10, 2003 to Non-final office action mailed Jun. 10, 2003", 20 pgs.

"U.S. Appl. No. 10-118576, Response filed Oct. 18, 2004 to Non-final office action mailed Aug. 16, 2004", 12 pgs.

"U.S. Appl. No. 10-744632, Final office action mailed Jan. 31, 2007", 11 pgs.

"U.S. Appl. No. 10-744632, Non-final office action mailed Jul. 2, 2007", 9 pgs.

"U.S. Appl. No. 10-744632, Non-final office action mailed Oct. 5, 2006", 15 pgs.

"U.S. Appl. No. 10-744632, Response filed Nov. 30, 2006 to Non-final office action mailed Oct. 5, 2006", 19 pgs.

"U.S. Appl. No. 10/744,632, Response filed Mar. 26, 2007 to Final Office Action mailed Jan. 31, 2007", 18 pgs.

"U.S. Appl. No. 10/744,632, Response filed Oct. 2, 2007 to Non-Final Office Action mailed Jul. 2, 2007", 19 pgs.

"U.S. Appl. No. 11/281,084, Non-Final Office Action mailed Jan. 22, 2007", 16 pgs.

"Non-Final Office Action mailed Oct. 18, 2007 in U.S. Appl. No. 10/929,932", OARN, 16.

US 7,256,487, 08/2007, Poo et al. (withdrawn)

* cited by examiner

METHOD FOR FABRICATING PACKAGED DIE

This application is a Divisional of U.S. application Ser. No. 10/929,932, filed Aug. 30, 2004, which is a Divisional of U.S. application Ser. No. 10/118,576, filed Apr. 8, 2002, now U.S. Pat. No. 6,894,386, which claims priority under 35 U.S.C. 119 from Singapore Application No. 200106182-9 filed Oct. 8, 2001, all of which are incorporated herein by reference.

TECHNICAL FIELD

The present invention relates generally to circuit packaging, and in particular to apparatus and methods for packaging integrated circuits.

BACKGROUND

Wafers are fabricated with a plurality of dies each having a plurality of integrated circuit elements therein. A die represents one individual chip that must be separated from adjacent dies before packaging. Contacts are added to the die before packaging. One type of contact is a solder ball. Wafer level packaging (WLP) refers to the complete packaging of an electronic component at the die or the wafer level. WLP is normally considered as a true chip size package. However, the profile of most WLP is the sum of the thickness of the die and the solder balls. It is desired to reduce the profile and/or thickness of packaged components.

For the reasons stated above, for other reasons stated below, and for other reasons which will become apparent to those skilled in the art upon reading and understanding the present specification, there is a need in the art for an improved electronic component package and methods of packaging electronic components.

SUMMARY

The present invention is directed to integrated circuit dies and their method of manufacture. An embodiment of the present invention includes an edge contact at a peripheral surface of the die. The edge contact connects to a bond pad through a line. In an embodiment, adjacent dies on a wafer are connected to a same edge contact. The edge contact is divided. In an embodiment, the edge contact is divided when the dies are separated. In an embodiment, the edge contact is in the saw street and is divided when the wafer is diced. The die, in some embodiments, includes a main body including a top layer, a bottom layer, and a peripheral edge surface extending between the top layer and the bottom layer. The main body includes an integrated circuit therein that is electrically connected to the bond pad. In an embodiment, the edge contact is beneath the top layer. In an embodiment, the edge contact is above the bottom layer such that the edge contact does not increase the height of the die. In an embodiment, the bond pad is at the top layer. In an embodiment, the die is encased by an encapsulant.

The present invention also includes methods for creating a die according to the present invention. An embodiment of the present invention includes fabricating at least two dies on a wafer, wherein the at least two dies are joined at an electrically conductive element in a saw street, and separating the at least two dies from each other along the saw street. At least part of the electrically conductive element remains with each die. In an embodiment, the electrically conductive element is created by forming a recess in the saw street and filling the recess with an electrically conducting material. In an embodiment of the present invention, the method includes connecting a bond pad from at least one of the dies to the electrically conductive material. In an embodiment, the present invention includes fabricating circuits for a memory device in at least one of the dies. In an embodiment of the present invention, forming the recess includes sawing along the saw street to a depth of about half a height of the die. In an embodiment, connecting the bond pad includes depositing a metal on the wafer between the bond pad and the electrically conductive material.

A further embodiment of the method according to the present invention includes patterning a recess in a saw street intermediate adjacent dies in a wafer, depositing an electrically conductive material in the recess to form an edge contact, connecting a bond pad of both dies to the edge contact, and separating the adjacent dies along the saw street such that each dies includes a part of the edge contact. An embodiment of the present invention includes masking the wafer such that the electrically conductive material is deposited only in the recess.

The present invention also includes substrates, wafers, integrated circuit packages, electrical devices, memory units, memory modules, electrical systems, computers, which include a die according to the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

The present description uses a reference number convention of the first digit corresponding to the figure in which the number references and the last two digits corresponding to like elements throughout the description. For example, the edge contact has a reference number of X09, where X is the number of figure on which the reference number appears.

Figure 1:
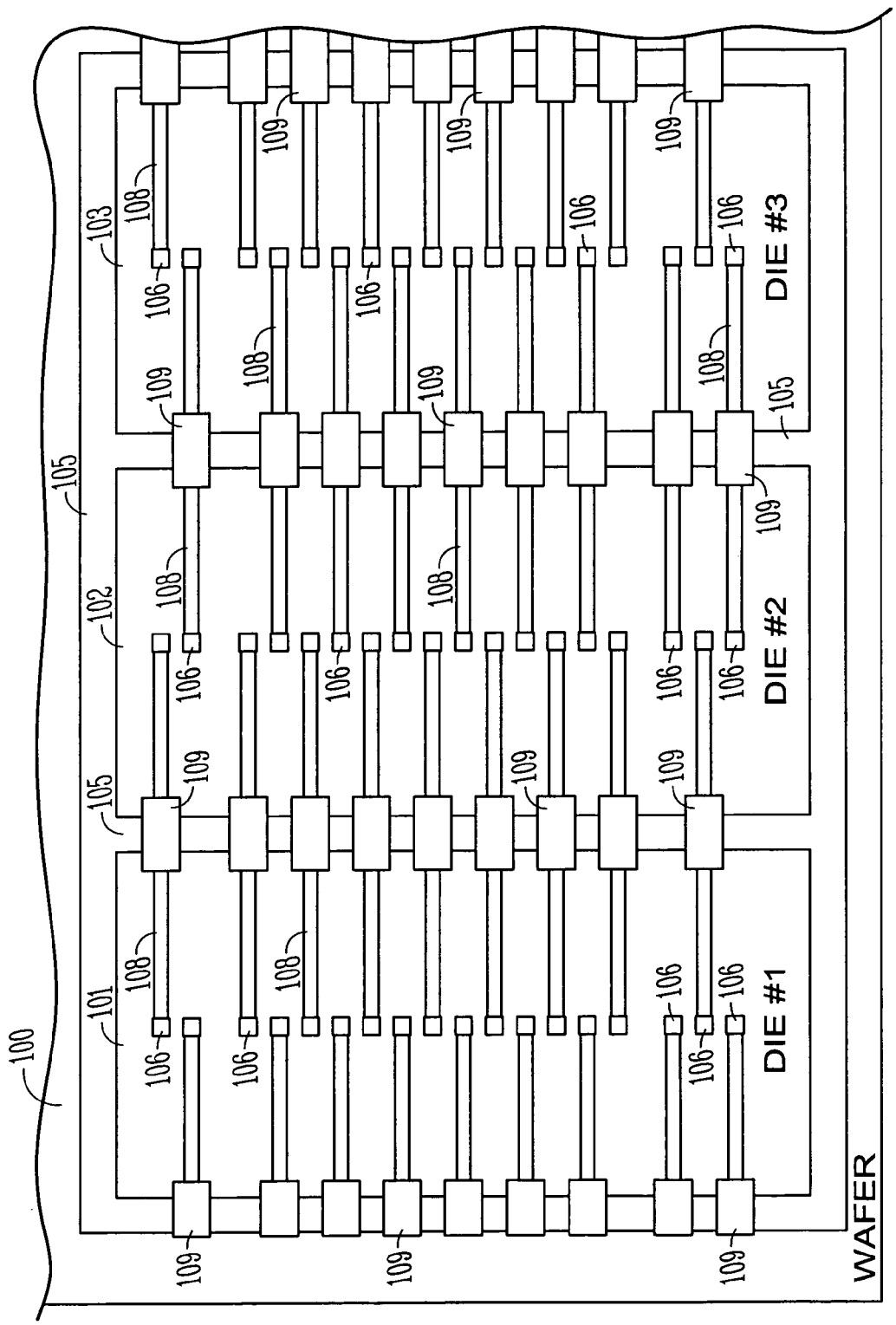
FIG. 1 is a top view of a wafer including a plurality of dies according to the present invention.

FIG. 1 shows a wafer 100 including a plurality of dies 101, 102, and 103 that are joined together along saw streets 105. Wafer 100 is illustrated as a square wafer but it will be understood that the wafer is not so limited and includes 200 millimeter, 300 millimeter, and 450 millimeter wafers known to those of skill in the art. Moreover, wafer 100 is illustrated with only three dies 101, 102, 103 thereon. It will be understood that the wafer 100 may have greater than two or three dies. In an embodiment, the wafer has greater than one thousand dies. A die is an individual pattern, typically rectangular, on a substrate or wafer that contains circuitry, or integrated circuit devices, to perform a specific function. Each die 101-103 includes an electrical circuit fabricated thereon according to known techniques. The die 101-103 include integrated circuit elements such as capacitors, transistors, line, interconnects, plugs, pads, I/O connections, insulators, and/or other elements known in the art. These integrated circuit elements form electronic components such as processors and memory devices. Examples of memory devices include DRAM, SRAM, SDRAM, EEPROM, flash memory, ROM, etc. In an embodiment, semiconductor wafer 100 contains a repeated pattern of such dies containing the same functionality.

Dies 101-103 include bonding pads 106. In an embodiment, dies 101-103 are identical and are formed by repeating a mask pattern on the wafer 100. In an embodiment, pads 106 are at the top layer of the die. In an embodiment, pads 106 have a top surface aligned with the top surface of the thus-formed die. In an embodiment, pads 106 are aligned lengthwise along the middle of the die. Other embodiments of the present invention are not limited to the pads 106 being positioned in the middle of the die. An electrically conductive line 108 extends from each of the pads 106 to the periphery of the die 101-103. Each line 108 electrically connects one pad 106 to one edge contact 109. Edge contacts 109 are positioned at the periphery of each die. Contacts 109 that are positioned at the periphery of two adjacent dies are integrally formed. That is, contacts 109 at the saw street 105 between die 101 and die 102 are connected to lines 108 of both die 101 and 102. These contacts 109 are separated during a separation or dicing operation as described herein. Each of the pads 106, lines 108, and contacts 109 are not labeled in FIG. 1 for clarity. Each unit of connected pad 106, line 108, and contact 109 act as input/output connections to the internal circuits of the die. In an embodiment, the dies 101-103 are separated and further processed, e.g., tested or packaged, to form an end integrated circuit product.

In an embodiment, third metal redistribution wafer level packaging technology is used on the wafer 100 to form the lines 108 from the bond pads 106 to the edge contacts 109. Channels are formed in the saw streets 105. In an embodiment, the wafer 100 is first sawed about half to about three-quarter way through at the saw streets 105. This forms the channels in the saw streets 105 between die 101-103. Electrically conductive material is patterned in the channels to form the edge contacts 109. Third metal redistribution on the wafer 100 creates the lines 108 out from the bond pads 106 to the edge contacts 109. In an embodiment, lines 108 on the adjacent dice 101, 102 or 102, 103 connect to the bond pads 106 of the adjacent die to a same edge contact as shown in FIG. 1. In an embodiment, the wafer 100 is coated with polymide (PI), benzocyclobutenes (BCB) or other non-conductive materials except at the edge contacts. Each individual die is then singulated by sawing, breaking at the saw-streets or grinding or other dicing methods known in the art. The electrical connections of the die 101, 102, or 103 to external devices are made through the edge contacts 109. In an embodiment, the singulated die 101, 102, or 103 is mounted on a printed circuit board with the land patterns created to correspond to the locations of via-holes on the board.

Figure 2:
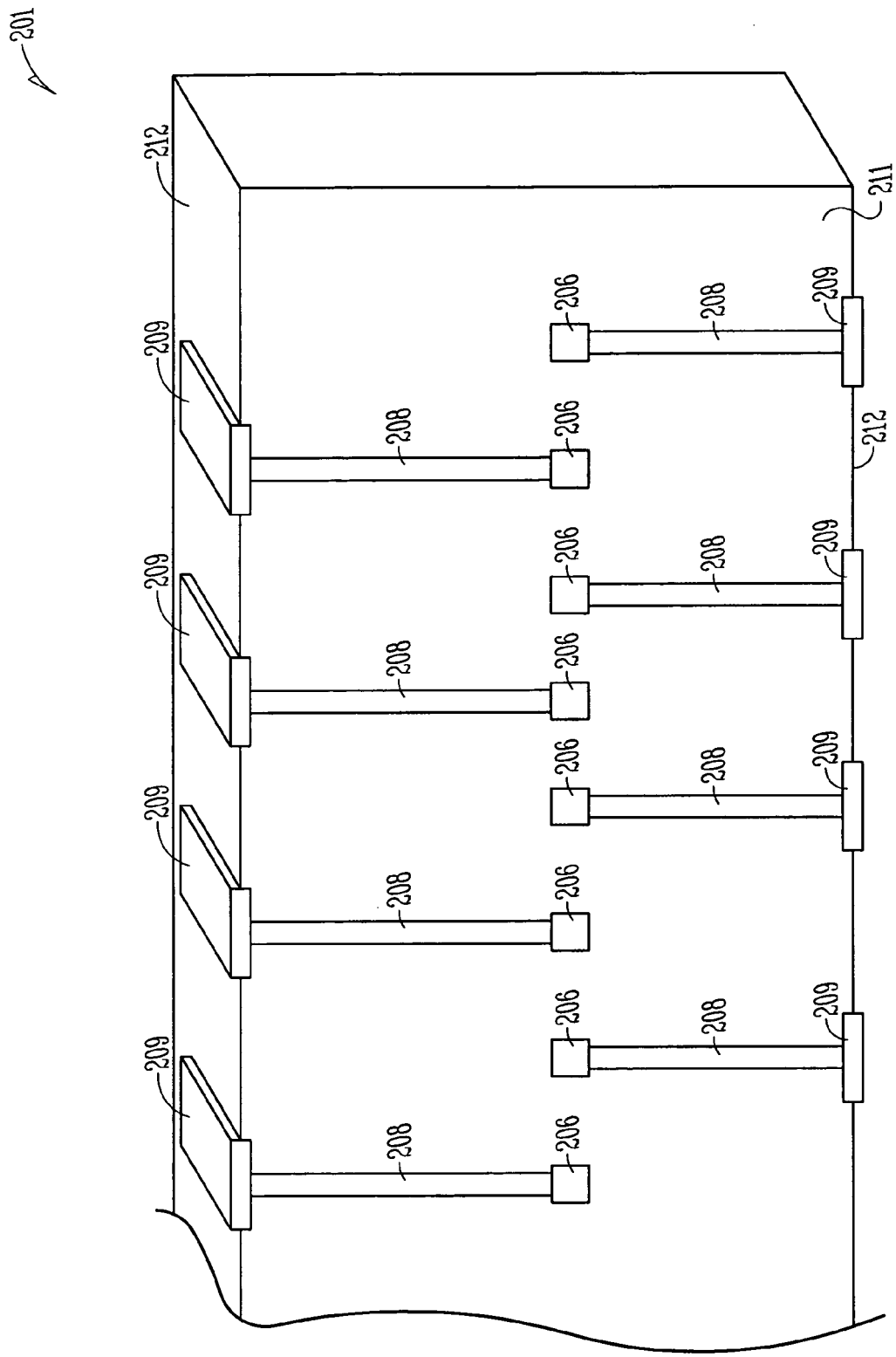
FIG. 2 is a perspective view of a die according to the present invention.

FIG. 2 shows a die 201 including bonding pads 206, electrically conductive lines 208 and contacts 209 according to the teachings of the present invention. In an embodiment, the pads 206 are flush with the top surface 211 of the die 201. In an embodiment, the lines 208 are flush with the top surface 211 of the die 201. In an embodiment, the top surface of the contacts 209 are flush with the top surface 211 of the die 201. In an embodiment, the top surface of the contacts 209 are beneath the top surface 211 of the die 201. In an embodiment, the contacts 209 extend outwardly from the side surface 212 of the die 201. In an embodiment, contacts 209 are metal. In an embodiment, contacts 209 include tungsten. In an embodiment, contacts 209 include titanium. In an embodiment, the contacts 209 include a noble metal. In an embodiment, the contacts 209 include gold. In an embodiment, contacts 209 include a gold coating on another metal or metal alloy. In an embodiment, the contacts 209 include silver. In an embodiment, contacts 209 include a silver coating on another metal or metal alloy. The gold or silver coatings on contacts 209 are provided to improve the electrical connection between the contacts and external devices in which the die or chip 209 will be placed. In another embodiment, the chip 209 is enclosed, except for at least a portion of the contacts 209, by an encapsulant. Encapsulants are known in the art of integrated circuit packaging.

Figure 3A:
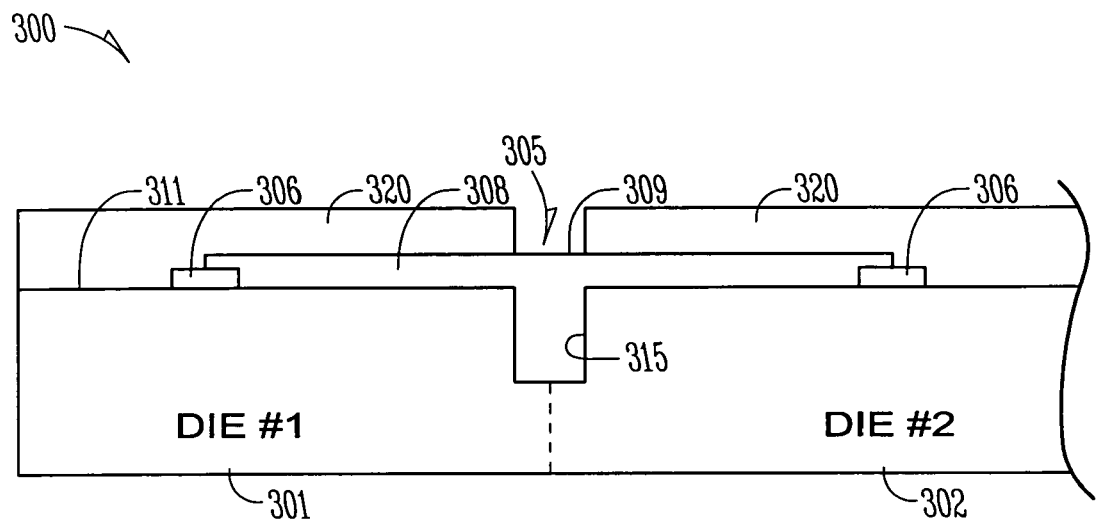
FIGS. 3A and 3B are cross sectional views of two dies according to an embodiment of the present invention.

An embodiment for fabricating the die according to the present invention will now be described with reference to FIGS. 3A-3D. FIG. 3A shows a partial view of a wafer 300, which has undergone fabrication processing steps to form the desired integrated circuits on each die 301, 302. The fabrication steps include masking, depositing, etching, and other steps as understood in the art. In the saw street 305, a recess 315 is formed. In an embodiment, a recess 315 is formed in each saw street 305. In an embodiment, a recess 315 is formed in each saw street 305 along the longitudinal (longest) length of a rectangular die. In an embodiment, the recess 315 is formed on other sides of the die. For example, on a rectangular or square die, recesses are formed on all four sides of the die. In an embodiment, recess 315 extends downwardly from the top surface 311 of wafer 300 about half the height of the wafer or die. The recess 315, in an embodiment, is formed while forming integrated circuit structures in the dies. In an embodiment, recess 315 is etched into the wafer 300 after the circuits are formed in each die 301, 302. In an embodiment, the recess 315 extends the entire length of the saw street 305. Bond pads 306 are formed on the dies 301, 302 according to conventional processes. After the bond pads 306 are formed, the wafer top surface 311 is masked leaving open the area of the metal lines from bond pads 306 of one die 301 to bond pads 306 of the adjacent die 302. It is within the scope of the present invention to use positive or negative resist mask with the present invention. The mask, in an embodiment, leaves open a wider area adjacent the saw street 305 on the dies 301, 302 and in the recess 315. The electrically conductive material for the lines 308 and the edge contacts 309 is deposited on the wafer 300. The material forms the lines 308 and edge contacts 309 in the open areas of the mask.

The recesses 315 are formed according to the present invention. The wafer 300, e.g., dies 301, 302 and saw street 305, is masked leaving openings aligned with the location of the edge contact 309. Edge contact material, such as metal, is deposited in the opening to form the edge contact 309. In an embodiment, the mask and edge contact material on the mask is removed from the wafer 300. In an embodiment, the lines 308 are formed to connect the edge contact to at least one of the bond pads 306 of the adjacent dies 301, 302.

After the formation of the lines 308 of each die 301, 302, which lines are connected at edge contacts 309, the wafer 300 receives a passivation layer 320. In an embodiment, passivation layer 320 is deposited according to conventional techniques. Passivation layer 320 covers the entire wafer except over the edge contacts 309. In an embodiment, passivation layer 320 does not cover the saw street 305. In an embodiment, passivation layer 320 includes inorganic polymers. In an embodiment, passivation layer 320 includes benzocyclobutenes (BCB). In an embodiment, passivation layer 320 includes polymides (PI). In an embodiment, passivation layer 320 includes at least one of silicon dioxide, silicon nitride, or silicon oxynitride. In an embodiment, passivation layer 320 includes organic polymers.

Figure 3B:
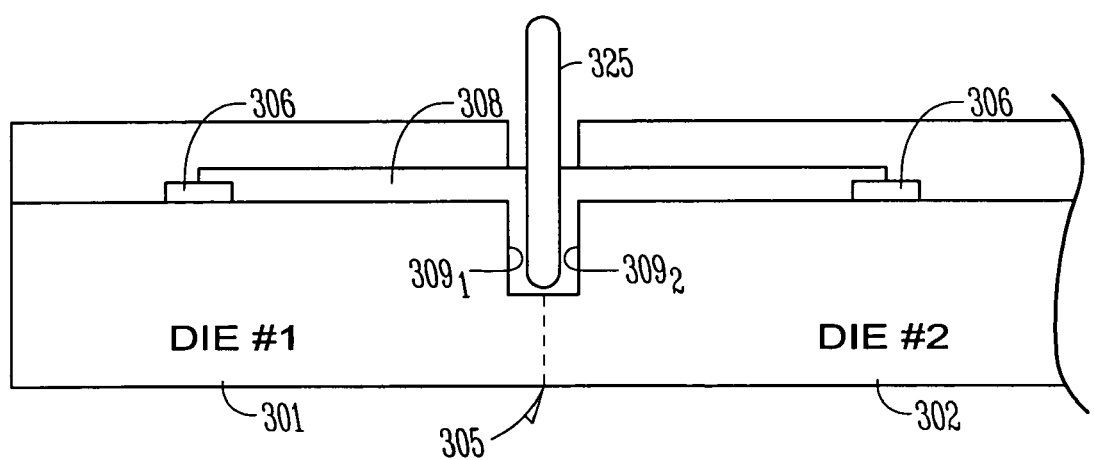
Figure 3C:
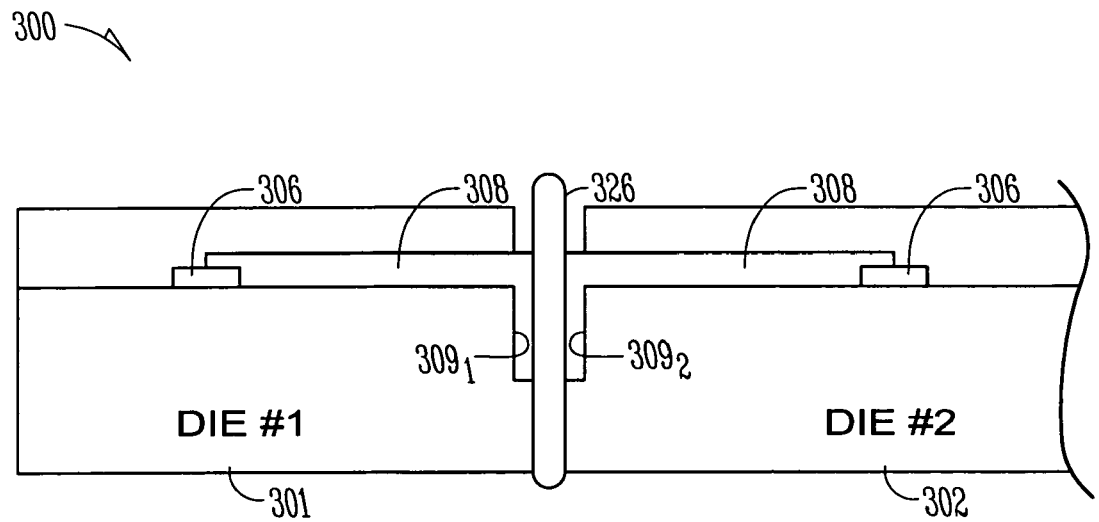
FIGS. 3C and 3D are cross sectional views of two dies according to an embodiment of the present invention.
Figure 3D:
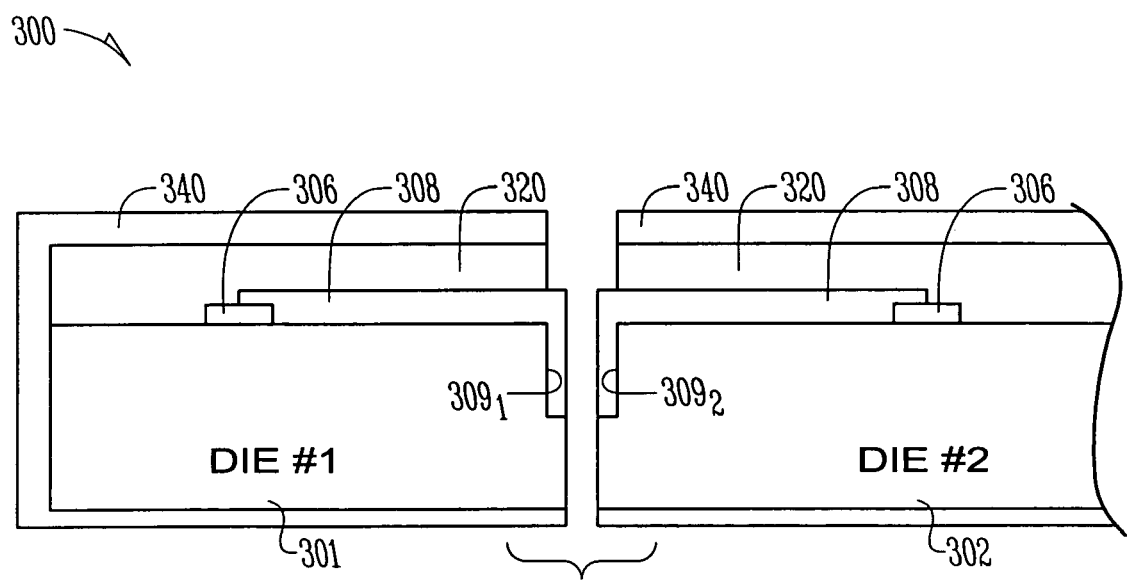

A cutter 325 is aligned with the saw street 305, and, in particular, with edge contact 309 (FIG. 3B). Cutter 325 cuts a center portion of the contact 309 to create edge contacts $309_1$ and $309_2$. Edge contact $309_1$ is on the peripheral edge surface of the first die 301. Edge contact $309_2$ is on the peripheral edge surface of the second die 302. In an embodiment, cutter 325 only cuts the contact 309, thus creating a scribe in the wafer 300 along saw street 305. Adjacent wafers 301, 302 can be separated along the scribe by using a scribe and break technique. Referring to FIG. 3C, the cutter 326 completely cuts through the wafer 300 along the saw street 305. In an embodiment, at least one of cutters 325, 326 is a saw. In an embodiment, both of cutters 325, 326 are saws. In an embodiment, at least one of cutters 325, 326 is a laser. After the dies 301, 302 are separated, each die 301, 302 includes edge contacts $309_1$, $309_2$ at peripheral surfaces of the die. Accordingly, the dies 301, 302 according to the teachings of the present invention have a height equal to the die or wafer height and the edge contacts 309 do not add to the height of the separated dies.

Once the dies 301, 302 are separated each is individually packaged in an encapsulant 340. The encapsulant 340 surrounds the dies 301, 302 except for at least part of the edge contacts 309. Thus, the encapsulant 340 protects the dies 301, 302 from an operating environment while the edge contacts 309 provide input and output signals to the circuits internal to the packaged die 301, 302.

Figure 4A:
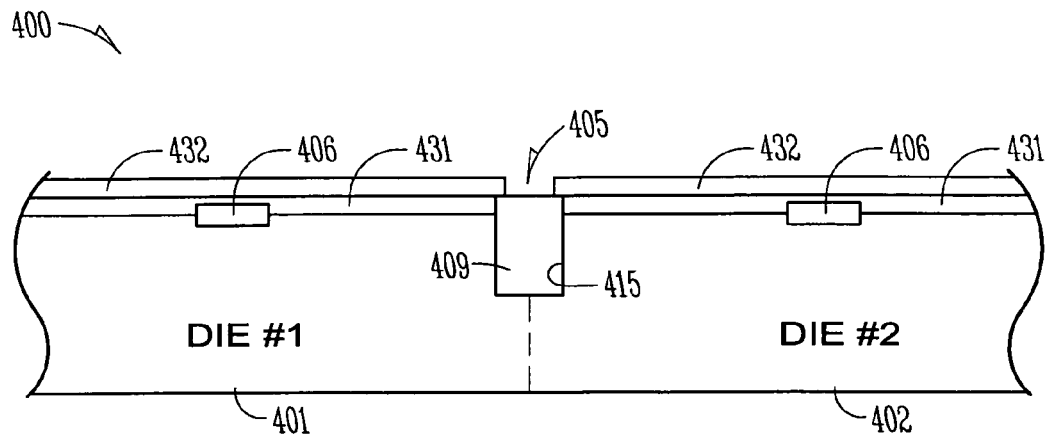
FIGS. 4A, 4B, and 4C are cross sectional views of two dies according to an embodiment of the present invention.
Figure 4B:
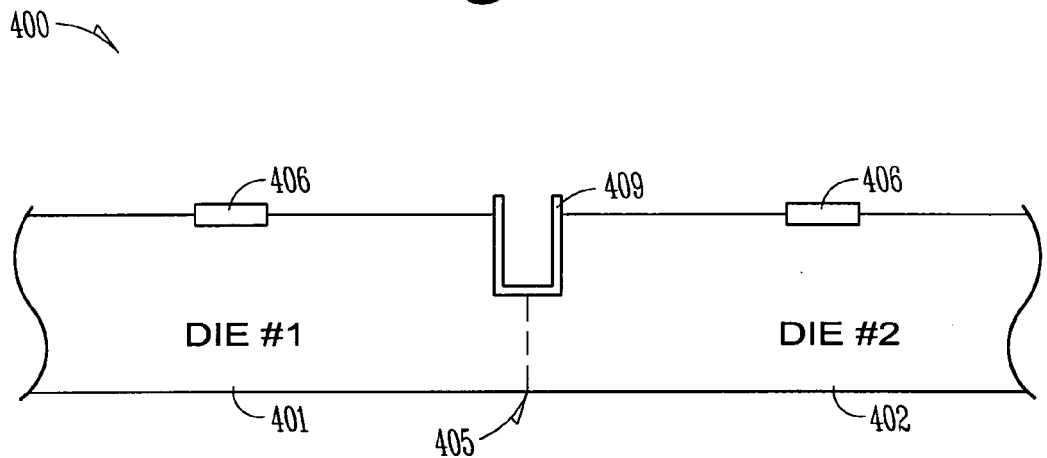
Figure 4C:
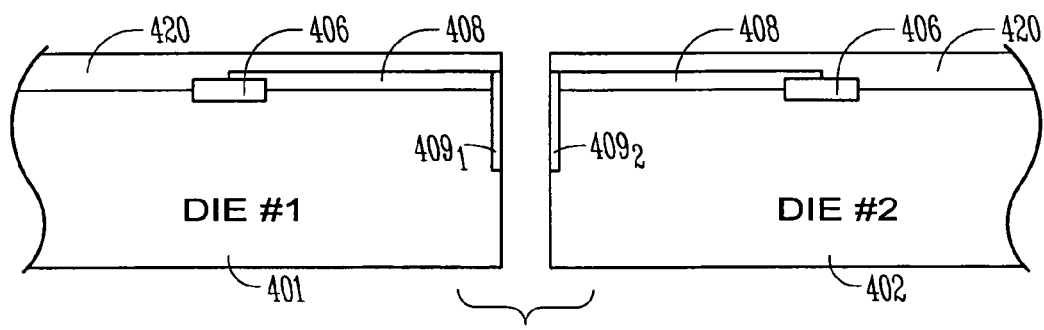

FIG. 4A-4C show an embodiment according to the teachings of the present invention. Wafer 400 includes a plurality of dies 401, 402. Each die 401, 402 includes circuits, such as integrated circuits, fabricated according to conventional processes. The circuits require communication to external circuits such as a buss, mother boards, and other electronic devices. Consequently, each die 401, 402 includes a bond pad 406. Wafer 400 further includes saw streets 405 dividing the dies 401, 402 whereat the dies are separated. A recess 415 is formed in the saw street 405 that is intermediate the dies 401, 402. For example, a mask layer 431 is formed over the wafer 400 except where the edge contact 409 is to be positioned. The mask layer 431 is formed according to techniques known to one of skill in the art. The electrically conductive material of the edge contact 409 is deposited into the recess. The conductive material of edge contact 409, in an embodiment, is sputtered onto the wafer. In an embodiment, the conductive material of the edge contact 409 is deposited by chemical vapor deposition. In an embodiment, the conductive material of the edge contact 409 is deposited by evaporation sources. In an embodiment, the conductive material of the edge contact 409 is deposited by electron gun evaporation. In an embodiment, the edge contacts 409 are formed after lines 408 are formed.

After formation of the unitary edge contact 409 in the form of a solid plug of electrically conductive material in the saw street recess 415, a second masking layer 432 is formed over the wafer 400. Masking layer 432 extends a distance over the sides of the contact 409. The width of the extension of the masking layer 432 over the contact 409 is essentially equal to the width of the finished edge contacts $409_1$ and $409_2$ on the respective dies 401 and 402. The unitary contact 409 is etched away where it is not covered by masking layer 432. In an embodiment, contact 409 is etched down to the portion of the wafer 400 beneath the recess. In an embodiment, contact 409 is etched so that it has a U-shape. Thereafter, the masking layers 431, 432 are removed (FIG. 4B). The dies 401 and 402 are then separated or diced (FIG. 4C). The individual dies 401 and 402 are then packaged, e.g., for example coated with an encapsulant, except for at least part of the edge contacts 409.

Figure 5:
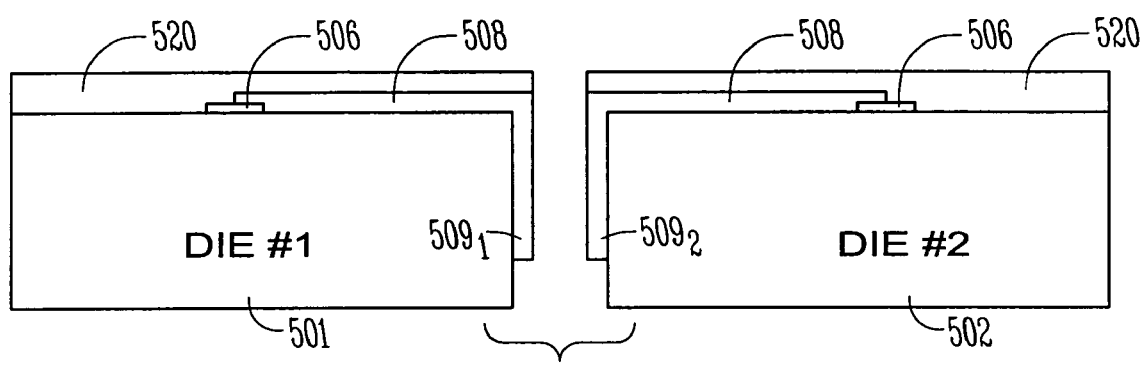
FIG. 5 is a view of two dies separated according to the teachings of an embodiment of the present invention.

FIG. 5 shows an embodiment according to the teachings of the present invention, which includes the wafer 500 being diced into a plurality of dies 501, 502. Each die 510, 502 includes bond pads 506 and electrical signal carrying lines 508. The edge contacts 509 are connected to the lines 508. The edge contacts 509 are formed according to the teachings of the present invention. The edge contacts 509, in this embodiment, extend to the top surface of the passivation layer 520. That is, the top surface of the edge contact 509 is essentially in the same plane as the top surface of the passivation layer. In an embodiment, the edge contacts 509 have a top surface that is essentially in the same plane as a top surface of the encapsulant encasing the die 501. In an embodiment, the edge contacts 509 have a bottom surface that is essentially in the same plane as a bottom surface of the encapsulant encasing the die 501. In an embodiment, the edge contacts 509 have a height greater than one-half the height of the peripheral edge surface of the die. In an embodiment, the edge contacts 509 extend along approximately 75% of the height of the peripheral surface of the die.

Figure 6:
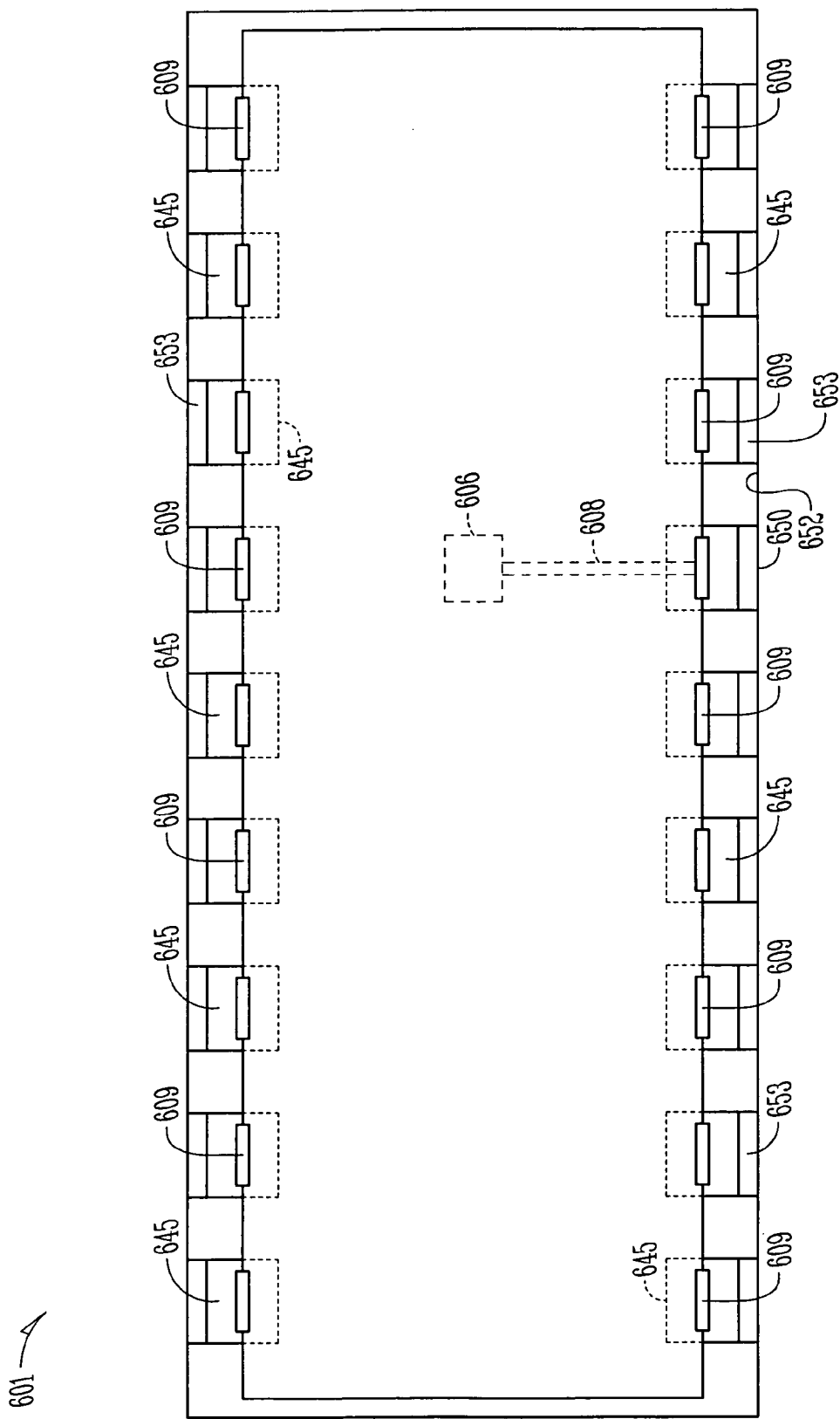
FIG. 6 is a top view of a die in a package according to the teachings of the present invention.

FIG. 6 shows top view of a singulated land grid array, packaged die 601 according to the teachings of the present invention. Each of the edge contacts 609 are in electrical and physical contact with a contact pad 645. The contact pads 645 extend under the main body of the packaged die 601. In an embodiment, contact pads 645 extend outward of the main body of the packaged die 601. Contact pads 645 act as contacts between the circuits external to the packaged die 601 and the die 601 through edge contacts 609, lines 608 and bond pads 606. Only one set of lines 608 and bond pads 606 are shown in FIG. 6 for sake of clarity. It will be understood that in an embodiment of the present invention each of the edge contacts 609 are connected to a line 608, which in turn is connected to a bonding pad 606. FIG. 6 further illustrates line 608 and pad 609 in broken line as they are covered by an encapsulation layer that surrounds the die per se and protects the internal circuits from the environment, e.g., dirt, debris, moisture and the like.

An electrical device 650 includes a socket, slot, recess or the like 652 which includes device contacts 653. The packaged die 601 is adapted to be received in the socket 652, wherein the contact pads 645 engage contacts 653. The contacts 653 are electrically connect with communication lines connected to external circuits of the electrical device 650. Electrical device 650 includes mother boards, computers, consumer electronics, printed circuit boards, and the like. The contact pads 645, in an embodiment, press fit against the device contacts 653 to hold the die 601 in the socket 652. In an embodiment, the edge contacts 609 directly contact device contacts 653.

An embodiment of the present invention includes fixing contact pads 645 to a substrate (not shown). The substrate is fixed to the bottom of the die. Encapsulant and substrate encase the die to protect it from the environment. Contact pads 645 and edge contacts 609 are electrically conductive. In an embodiment, pads 645 and contacts 609 are made of a metal. In an embodiment, at least one of contacts 609 and pads 645 include a metal alloy. In an embodiment, pads 645 include copper. In an embodiment, pads 645 include a noble metal. In an embodiment, pads 645 include gold. In an embodiment, pads 645 include silver. The encapsulant, in an embodiment, encases the die without a substrate.

Circuit Modules

Figure 7:
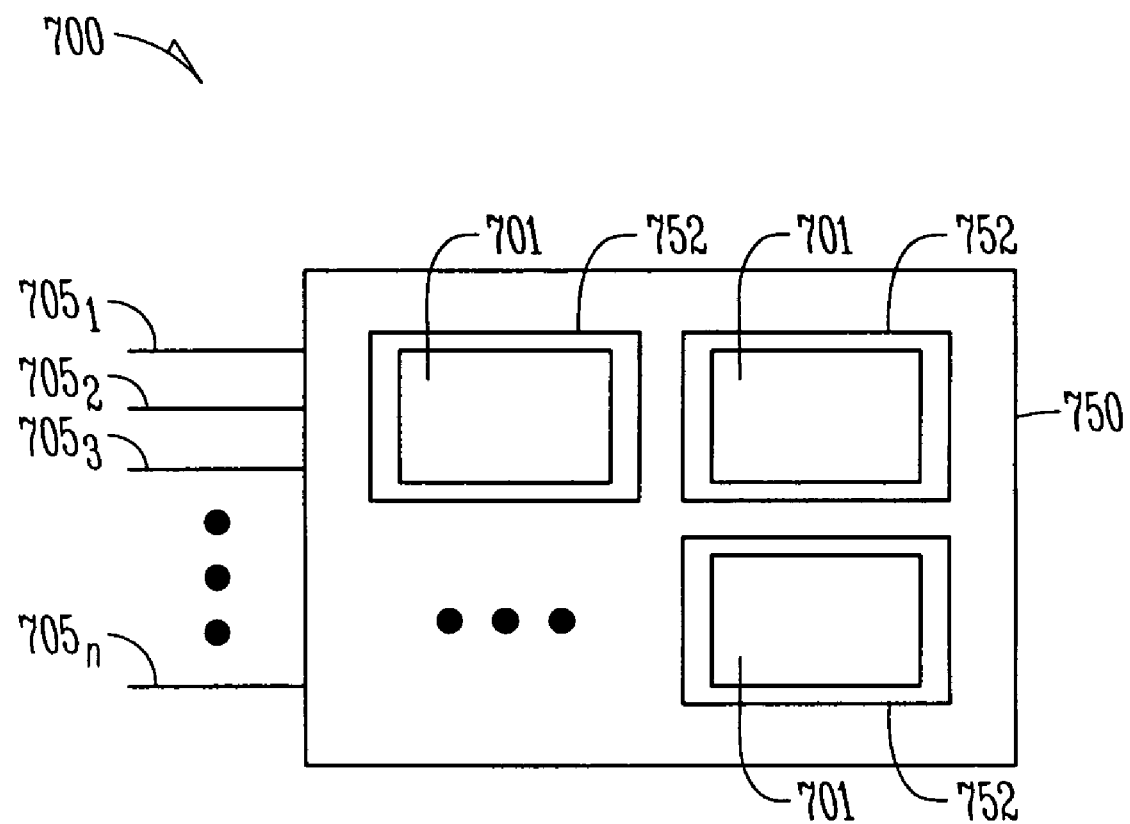
FIG. 7 is a view of a circuit module according to the teachings of the present invention.

As shown in FIG. 7, two or more dies 701 may be combined, with or without protective casing, into a circuit module 700 to enhance or extend the functionality of an individual die 701. Circuit module 700 may be a combination of dies 701 representing a variety of functions, or a combination of dies 701 containing the same functionality. In an embodiment, circuit module 700 includes at least one socket, slot, recess or the like 752 into which the die 701 is received. One or more dies 701 of circuit module 700 include I/O structures in accordance with the invention and/or are fabricated in accordance with the present invention. In an embodiment, dies 701 are inserted into a slot 752 in a circuit board 750 such that the contacts 209, 309, 509, or 609 are in electrical communication with the contacts in the slot 752. In an embodiment, contacts 209, 309, 509, or 609 are in physical contact with contacts in the slot 752. In an embodiment, the contacts 209, 309, 509, or 609 are press fit into the slot 752 against the contacts of the slot.

Numeral 752 in FIG. 7, in another embodiment, represents a mount including land patterns whereat the contacts according to the present invention are mounted. The mounting process includes an SMT process. For example, circuit module 700 is a printed circuit board having land patterns on which solder paste is applied, e.g., by printing the solder paste. A die 701 is picked and placed at the mount with the die contacts 209, 309, 509, or 609 aligned with the paste covered contacts of the mount. Either the die contacts or the mount contacts are reflowed to create a physical and electrical connection.

Some examples of a circuit module include memory modules, device drivers, power modules, communication modems, processor modules and application-specific modules, and may include multilayer, multichip modules. Such modules will have a chip receiver in which a chip according to the present invention is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 700 will have a variety of leads $705_1$ through $705_N$ extending therefrom and coupled to the contacts 209, 309, 409, or 509 of dies 701 providing unilateral or bilateral communication and control.

Figure 8:
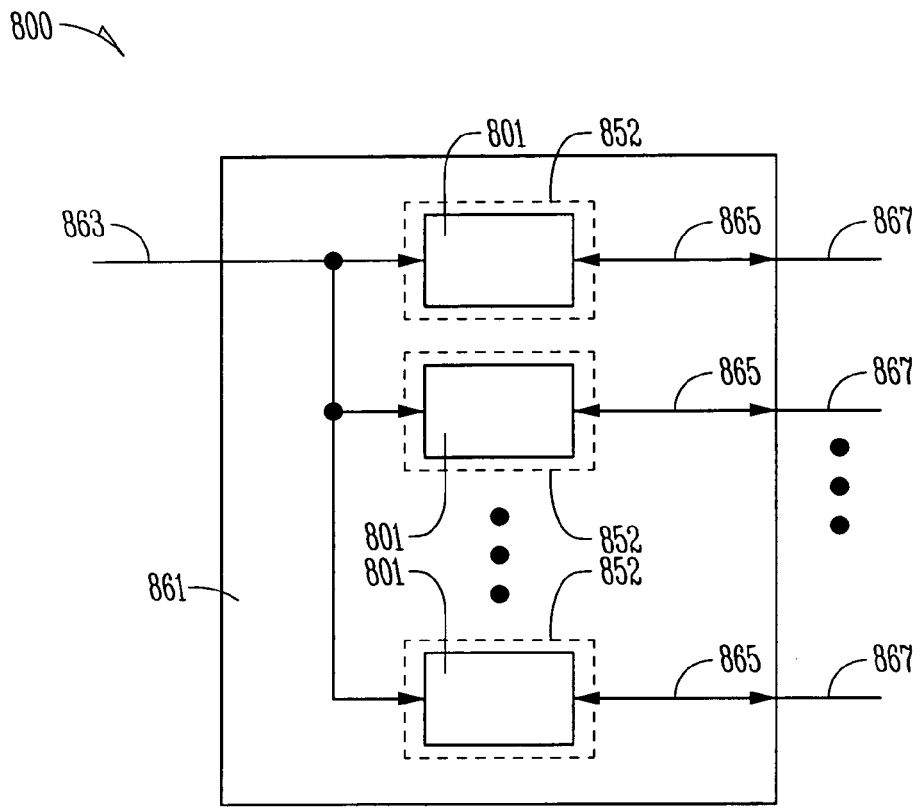
FIG. 8 is view of a memory module according to the teachings of the present invention.

FIG. 8 shows one embodiment of a circuit module as memory module 800. Memory module 800 contains multiple memory devices 801 contained on support 861. In an embodiment, support 861 includes slots 852 for receiving memory devices 801 as described herein. The number of memory devices generally depends upon the desired bus width and the desire for parity. Memory devices 801 include at least die in accordance with to the present invention. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 815. Leads 867 are shown for conceptual purposes and are not limited to the positions shown in FIG. 8.

Electronic Systems

Figure 9:
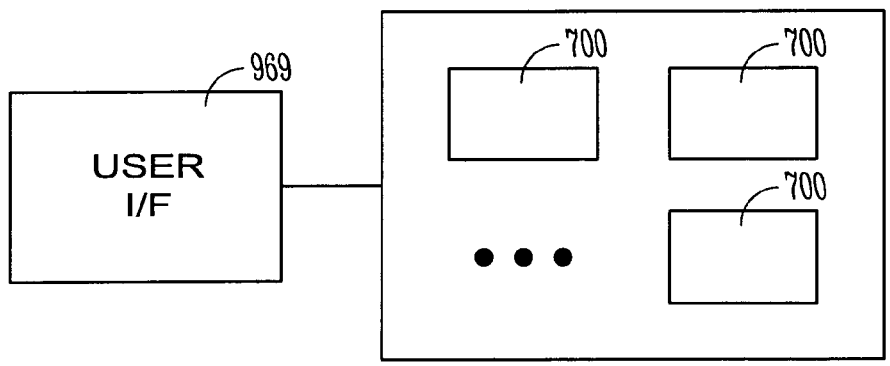
FIG. 9 is a view of an electronic system according to the teachings of the present invention.

FIG. 9 shows one embodiment of an electronic system 900 containing one or more circuit modules 700. At least one of the circuit modules 700 contains a die in accordance with the present invention. Electronic system 900 generally contains a user interface 969. User interface 969 provides a user of the electronic system 900 with some form of control or observation of the results of the electronic system 900. Some examples of user interface 969 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provided to, electronic system 900. In an embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that the one or more circuit modules 700 in electronic system 900 can be replaced by a single integrated circuit. Furthermore, electronic system 900 may be a subcomponent of a larger electronic system.

Figure 10:
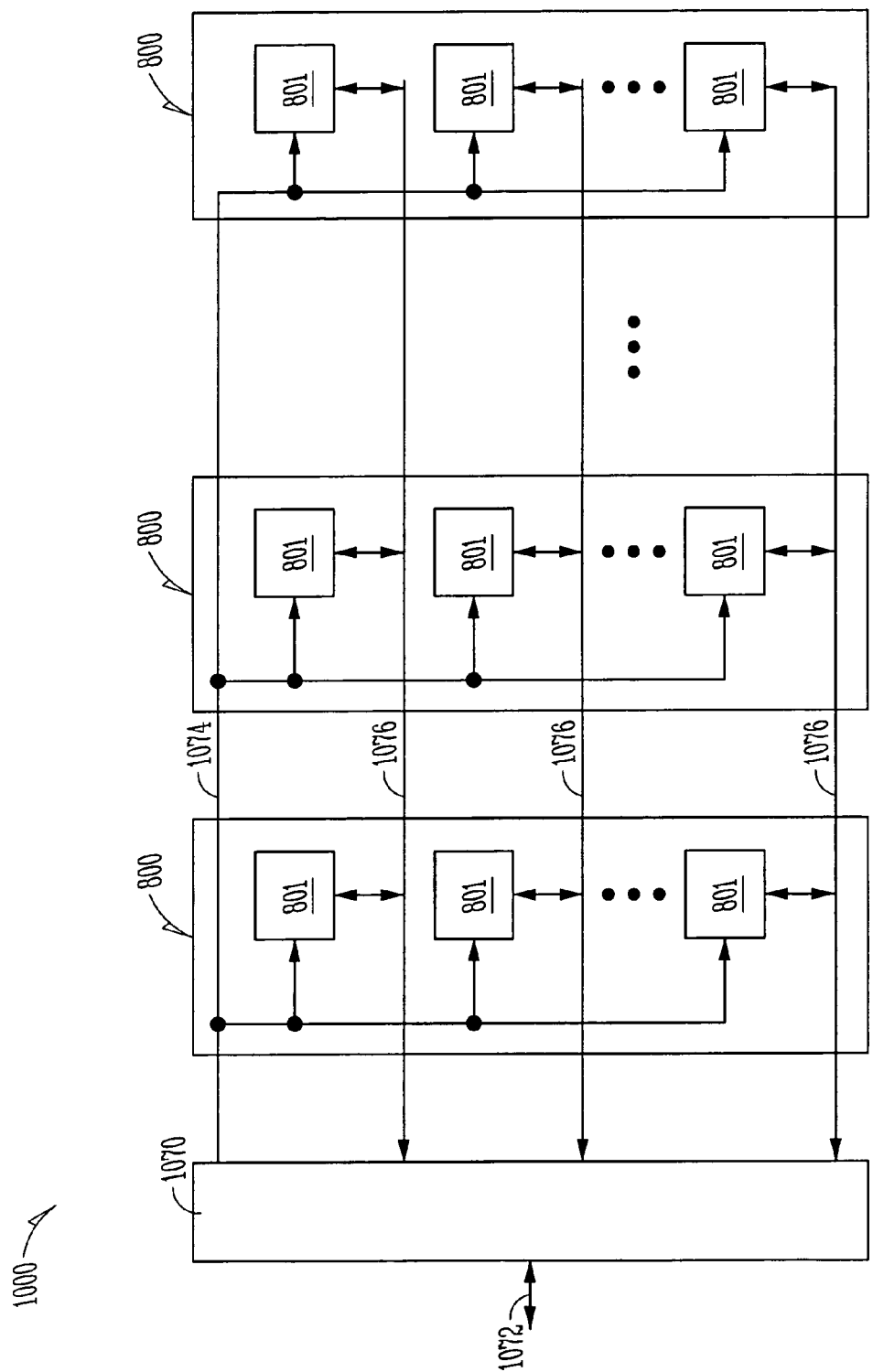
FIG. 10 is a view of an embodiment of an electronic system according to the teachings of the present invention.

FIG. 10 shows one embodiment of an electronic system as memory system 1000. Memory system 1000 contains one or more memory modules 800 and a memory controller 1070. At least one of the memory modules 800 includes a die in accordance with the present invention. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 11:
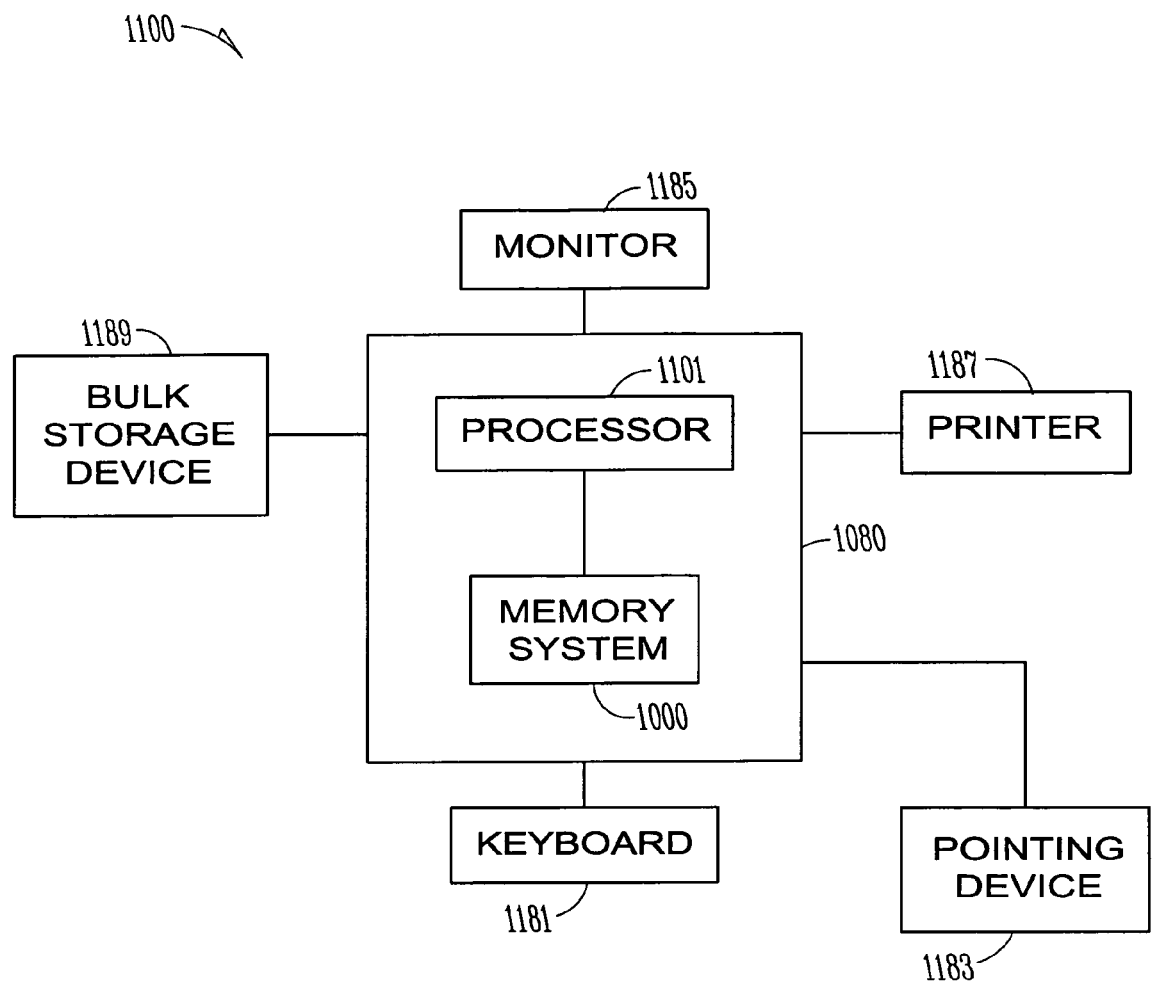
FIG. 11 is a view of a computer system according to the teachings of the present invention.

FIG. 11 shows a further embodiment of an electronic system as a computer system 1100. Computer system 1100 contains a processor 1101 and a memory system 1000 housed in a computer unit 1180. In an embodiment, the memory system 1000 includes a die in accordance with the present invention. In an embodiment, processor 1101 includes a die in accordance with the present invention. Computer system 1100 is but one example of an electronic system containing another electronic system, i.e., memory system 1000, as a subcomponent. Computer system 1100 optionally contains user interface components. Depicted in FIG. 11 are a keyboard 1181, a pointing device 1183 such as a mouse, trackball, or joystick, a monitor 1185, a printer 1187 and a bulk storage device 1189. It will be appreciated that other components are often associated with computer system 1100 such as modems, device driver cards, additional storage devices, etc. These other components, in an embodiment, include a die in accordance with the present invention. It will further be appreciated that the processor 1101 and memory system 1000 of computer system 1100 can be incorporated on a single integrated circuit. Such single package processing units reduce the communication time between the processor and the memory circuit.

CONCLUSION

It is desired to reduce the size of packaged components. This results in packaging material savings and increases throughput by reducing packaging times. Moreover, with the growing popularity of smaller electronic device the electronic components must be as small as possible. The present invention further provides methods for producing a packaged die. In an embodiment, the cutter cuts along the saw street but does not cut all the way through the wafer. Thus, channels intermediate the dies are created. Edge contact material is deposited or patterned in the channels. The dies are diced. The dies will have edge contacts around the periphery of the die. Thus, the contacts do not add to the height of the die and/or package. Accordingly, the present invention provides an extremely low profile package, i.e., the package thickness is essentially the same as the die thickness. Shorter length contacts of the present invention further provides superior signal integrity along with space savings.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. For another example, other integrated circuit fabrication processes are adapted to produce the dies and chips according to the present invention. Accordingly, this application is intended to cover any adaptations or variations of the invention. It is manifestly intended that this invention be limited only by the following claims and equivalents thereof.

What is claimed is:

1. A method, comprising:
    fabricating at least two dies on a wafer, wherein the at least two dies are joined at a saw street;
    forming a recess in the saw street;
    filling the recess with an electrically conducting material;
    connecting a bond pad from at least one of the dies to the electrically conductive material with a metal on each die between the bond pad and the electrically conductive material; and
    separating the at least two dies from each other along the saw street.

2. The method of claim 1, wherein the fabricating at least two dies includes fabricating circuits for a memory device on at least one of the dies.

3. The method of claim 1, wherein forming the recess includes sawing along the saw street to a depth of about half a height of the die.

4. The method of claim 1, wherein connecting the bond pad includes depositing a metal on the wafer between the bond pad and the electrically conductive material.

5. A method, comprising:
    patterning a recess in a saw street intermediate adjacent dies in a wafer;
    depositing an electrically conductive material in the recess to form an edge contact;
    connecting a bond pad of both dies to the edge contact by forming a metal line on each die between the bond pad and the edge contact; and
    separating the adjacent dies along the saw street such that each dies includes a part of the edge contact.

6. The method of claim 5, wherein pattering the recess includes masking the wafer such that the electrically conductive material is deposited only in the recess.

7. The method of claim 6, wherein the patterning includes masking the recess such that the electrically conductive material forms a plurality of individual edge contacts.

8. The method of claim 7, further comprising extending the recess the length of the saw street.

9. A method, comprising:
    fabricating at least two dies on a wafer, wherein the at least two dies are joined at a saw street, wherein fabricating the dies includes fabricating a memory on at least one die;
    forming a recess in the saw street;
    filling the recess with an electrically conducting material;
    connecting a bond pad from at least one of the dies to the electrically conductive material by forming a metal on each die between the bond pad and the electrically conductive material; and
    separating the at least two dies from each other along the saw street.

10. The method of claim 9, wherein fabricating the dies includes fabricating a memory on at least one die includes fabricating at least one of DRAM, SRAM, SDRAM, EEPROM, and flash memory.

11. The method of claim 9, wherein forming the recess includes sawing along the saw street to a depth of about half a height of the die.

12. The method of claim 11, wherein connecting the bond pad includes depositing a metal on the wafer between the bond pad and the electrically conductive material.

13. A method of forming an electrical system, comprising:
forming a first circuit having first contacts, and
forming a die having an integrated circuit formed therein, wherein the die includes:
a main body including a top layer, a bottom layer, and a peripheral edge surface extending between the top layer and the bottom layer;
forming a bond pad on the main body;
forming an edge contact at the peripheral edge surface, the edge contacts being in electrical communication with the first contacts; and
connecting a line to the bond pad to the edge contact.

14. The method of claim 13, wherein forming the edge contacts includes directly physically contacting the first contacts.

15. The method of claim 13, wherein forming the first circuit includes fabricating a communication bus.

16. The method of claim 13, wherein forming the die includes forming the main body to a first height, and forming the edge contact to a second height less than the first height.

17. The method of claim 14, wherein forming the die includes fabricating a memory device.

18. The method of claim 17, wherein fabricating the memory device includes fabricating at least one of an SRAM, SDRAM, and flash memory.

19. A method of forming an electrical system, comprising:
forming a first circuit having first contacts, and
forming a die having an integrated circuit formed therein, wherein forming the die includes: forming a main body to a first height and including a top layer, a bottom layer, and a peripheral edge surface extending between the top layer and the bottom layer;
forming a bond pad on the main body;
forming edge contacts to a second height essentially equal to the first height at the peripheral edge surface, the edge contacts being in electrical communication with the first contacts; and
connecting a line to the bond pad to the edge contact.

20. The method of claim 19, wherein the bond pad is formed at the top layer.

21. The method of claim 19, wherein the edge contact is formed beneath the top layer.

22. The method of claim 19, wherein the edge contact is formed above a bottom surface of the bottom layer such that the edge contact does not increase a height of the die.

23. The method of claim 22, wherein forming the edge contacts includes forming the edge contact to include at least one of copper, gold, or silver.

24. A method of forming an electrical system, comprising:
forming a first circuit having first contacts, and
forming a die having an integrated circuit formed therein, wherein forming the die includes: forming a main body to a first height and including a top layer, a bottom layer, and a peripheral edge surface extending between the top layer and the bottom layer;
forming a bond pad on the main body at the top layer;
forming edge contacts to a second height essentially equal to the first height at the peripheral edge surface, the edge contacts being in electrical communication with the first contacts; and
connecting a line to the bond pad to the edge contact.

* * * * *

UNITED STATES PATENT AND TRADEMARK OFFICE
CERTIFICATE OF CORRECTION

| | |
|---|---|
| PATENT NO. | : 7,358,154 B2 |
| APPLICATION NO. | : 11/281084 |
| DATED | : April 15, 2008 |
| INVENTOR(S) | : Poo et al. |

It is certified that error appears in the above-identified patent and that said Letters Patent is hereby corrected as shown below:

In column 10, line 39, in Claim 6, delete "pattering" and insert -- patterning --, therefor.

Signed and Sealed this

First Day of July, 2008

JON W. DUDAS
*Director of the United States Patent and Trademark Office*